(12) United States Patent
Yang

(10) Patent No.: US 10,692,438 B2
(45) Date of Patent: Jun. 23, 2020

(54) DISPLAY PANEL AND DISPLAY DEVICE

(71) Applicant: Wuhan Tianma Micro-Electronics Co., Ltd., Wuhan (CN)

(72) Inventor: Xingxing Yang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/892,221

(22) Filed: Feb. 8, 2018

(65) Prior Publication Data

US 2018/0166018 A1  Jun. 14, 2018

(30) Foreign Application Priority Data

Oct. 30, 2017  (CN) .......................... 2017 1 1042465

(51) Int. Cl.
G09G 3/3266 (2016.01)
G09G 3/3225 (2016.01)
H01L 27/32 (2006.01)

(52) U.S. Cl.
CPC ......... *G09G 3/3266* (2013.01); *G09G 3/3225* (2013.01); *H01L 27/32* (2013.01); *G09G 2310/0232* (2013.01); *G09G 2320/0233* (2013.01)

(58) Field of Classification Search
None
See application file for complete search history.

(56) References Cited

U.S. PATENT DOCUMENTS

| 2004/0135956 A1* | 7/2004 | Kim | G02F 1/1345 349/148 |
| 2007/0285370 A1* | 12/2007 | Kim | G02F 1/1345 345/92 |
| 2010/0156945 A1* | 6/2010 | Yoshida | G02F 1/1345 345/690 |
| 2012/0092308 A1* | 4/2012 | Chiang | G02F 1/1345 345/204 |
| 2017/0249906 A1* | 8/2017 | Noh | G09G 3/3266 |

(Continued)

FOREIGN PATENT DOCUMENTS

| CN | 101131491 A | 2/2008 |
| CN | 1495700 A | 5/2014 |
| CN | 106448587 A | 2/2017 |

(Continued)

*Primary Examiner* — Benjamin C Lee
*Assistant Examiner* — Krishna P Neupane
(74) *Attorney, Agent, or Firm* — Alston & Bird LLP

(57) ABSTRACT

Provided are a display panel and a display device, where a display area of the display panel includes a first display area and a second display area, each of the first display area and the second display area includes a plurality of pixels arranged in an array, and the quantity of pixels in at least one row of pixels in the first display area is less than the quantity of pixels in any row of pixels in the second display area. The display panel further includes a gate driving circuit and a plurality of scan signal lines, and at least one of the scan signal lines provides a scan signal for a row of the pixels. The display panel further includes resistance compensation units connected to the scan signal lines of the first display area, and the resistance compensation units are metal or metal oxide conducting wires.

16 Claims, 15 Drawing Sheets

(56) References Cited

U.S. PATENT DOCUMENTS

2017/0352311 A1* 12/2017 Lee .................... G09G 3/3225
2018/0129106 A1*  5/2018 Gao ................. G02F 1/134363

FOREIGN PATENT DOCUMENTS

| CN | 106711180 A | 5/2017 |
| CN | 107123394 A | 9/2017 |
| CN | 107611142 A | 1/2018 |

* cited by examiner

DISPLAY PANEL AND DISPLAY DEVICE

This application claims the benefit of Chinese Patent Application No. CN 201711042465.3, filed with the Chinese Patent Office on Oct. 30, 2017, which is hereby incorporated by reference in its entirety.

FIELD

The present disclosure relates to the technical field of displaying, and particularly to a display panel and display device.

BACKGROUND

A display panel commonly used at this stage may be generally divided into a display area for displaying an image and a non-display area for arranging peripheral driving circuits and the like. Pixels distributed in an array in the display area are respectively connected to a driving circuit or the like in the non-display area through a switching element. Generally, each switching element is connected with a scan line and a data line, and the switching element is turned on by receiving a scan signal of the scan line. By receiving a data line of the data line, the pixels are driven to display a certain grayscale, and switching elements of different pixels are connected to different combinations of scan lines and data lines so that each pixel may emit light separately. Currently, the display areas of common display panels are all regular rectangles. Therefore, the number of pixels in each row is the same, and a row of pixels is driven by a scan line at the same time.

However, with the development of display technology and the ever-increasing demands on display screens, it is necessary to adopt an irregular-rectangle special-shaped display screen in some cases, such as a circular display screen applied to an electronic watch, and a full screen adopted to increase the screen-to-body ratio. In this case, the pixels in the special-shaped part of the display area may no longer be arranged in a rectangular array, so the number of pixels in each row is not necessarily the same. Therefore, the loads of the scan lines driving the pixels in different rows are no longer the same, and further the display brightness of the special-shaped area and the display brightness of non special-shaped area are also different when the same scan signal is provided by the scan lines in the special-shaped area and the non special-shaped area. Therefore, the special-shaped display panel has poor display uniformity and unsatisfactory display effect.

SUMMARY

Embodiments of the present disclosure provide a display panel and a display device for improving the uniformity of display brightness and optimizing the display effect.

According to a first aspect, an embodiment of the present disclosure provides a display panel, where the display panel includes: a display area and a non-display area adjacent to the display area. The display area includes a first display area and a second display area, each of the first display area and the second display area includes a plurality of pixels arranged in an array; and a quantity of pixels in at least one row of pixels in the first display area is less than a quantity of pixels in any row of pixels in the second display area. The display panel further includes a gate driving circuit and a plurality of scan signal lines, the gate driving circuit is arranged in the non-display area, each of the scan signal lines is connected to an output terminal of the gate driving circuit, and at least one of the scan signal lines provides a scan signal for one row of the pixels. The display panel further includes: resistance compensation units connected to the scan signal lines of the first display area; where the resistance compensation units are metal or metal oxide conducting wires.

In a possible implementation, in the foregoing display panel provided by the embodiment of the present disclosure, a resistivity of the resistance compensation units is 0.55-5.6 $\Omega$m.

In a possible implementation, in the above display panel provided in the embodiment of the present disclosure, the display panel further includes thin film transistors located in the display area and arranged in one to one correspondence to the pixels. Each of the thin film transistors includes a gate, a source and a drain, where the source and the drain are arranged at a same layer, and the gate and the source are arranged at different layers.

In a possible implementation, in the foregoing display panel provided in the embodiment of the present disclosure, the resistance compensation units are configured at a same layer and made of a same material as the gates.

In a possible implementation, in the foregoing display panel provided in the embodiment of the present disclosure, the display panel further includes signal lines, and the resistance compensation units and the signal lines have overlapped areas in a direction perpendicular to the display panel.

In a possible implementation, in the foregoing display panel provided in the embodiment of the present disclosure, the metal or metal oxide conducting wires are in a shape of fold line, curve or spiral.

In a possible implementation, in the foregoing display panel provided by the embodiment of the present disclosure, a line width of each of the metal or metal oxide conducting wires is 2.5-3 μm.

In a possible implementation, in the foregoing display panel provided in the embodiment of the present disclosure, each of the resistance compensation units is arranged at a metal layer between a gate layer and a source layer.

In a possible implementation, in the foregoing display panel provided in the embodiment of the present disclosure, the resistance compensation units are configured at a same layer and made of a same material as the sources.

In a possible implementation, in the foregoing display panel provided in the embodiment of the present disclosure, the resistance compensation units are connected with the scan signal lines through via holes.

In a possible implementation, in the foregoing display panel provided in the embodiment of the present disclosure, the resistance compensation units are located between the gate driving circuit and the scan signal lines; or, the resistance compensation units are located at ends, far away from the gate driving circuit, of the scan signal lines.

In a possible implementation, in the foregoing display panel provided in the embodiment of the present disclosure, each of the pixels includes an anode, a light emitting layer and a cathode that are stacked one above another. The resistance compensation units are configured at the same layer and made of the same material as the anodes.

In a possible implementation, in the foregoing display panel provided in the embodiment of the present disclosure, an edge of the first display area has a curved edge, rounded corner, chamfered corner or notch.

In a possible implementation, in the foregoing display panel provided in the embodiment of the present disclosure, the pixel rows in the first display region are respectively connected with the plurality of scan signal lines; and at least two of the scan signal lines are respectively connected to one of the resistance compensation units.

In a possible implementation, in the foregoing display panel provided in the embodiment of the present disclosure, quantities of pixels in the respective pixel rows in the first display area sequentially increase in a column direction; and the resistances of the resistance compensation units connected to a same type of the scan signal lines corresponding to the pixel rows sequentially decrease in the column direction.

In a possible implementation, in the foregoing display panel provided in the embodiment of the present disclosure, a difference between a resistance of a resistance compensation unit corresponding to a pixel row having the smallest quantity of pixels and a resistance of a resistance compensation unit corresponding to a pixel row having the largest quantity of pixels is not more than 1110Ω.

In a possible implementation, in the foregoing display panel provided in the embodiment of the present disclosure, the first display area includes a first subregion, a middle region, and a second subregion; and the first subregion and the second subregion are located on both sides of the middle region. A part of pixels in each row of pixels in the first display area are located in the first subregion, and remaining pixels in each row of pixels in the first display area are located in the second subregion.

In a possible implementation, in the foregoing display panel provided in the embodiment of the present disclosure, the middle region is a hollow region or a transparent display area.

In a possible implementation, in the foregoing display panel provided in the embodiment of the present disclosure, the first display area and the second display area are controlled separately or in a coordinated way.

According to a second aspect, an embodiment of the present disclosure provides a display device, which includes any one of the display panels described above.

In a possible implementation, in the foregoing display device provided in the embodiment of the present disclosure, the display device further includes: an image collecting structure. The image collecting structure is arranged in a middle region or a hollow region of the display panel.

In a possible implementation, in the foregoing display device provided in the embodiment of the present application, the display device further includes one or a combination of a receiver, a light sensor, a distance sensor, an iris recognition sensor and a fingerprint recognition sensor. An orthographic projection of one or a combination of the image collecting structure, a camera, the receiver, the light sensor, the distance sensor, the iris recognition sensor and the fingerprint recognition sensor in the display device on the display panel is located within an orthographic projection of the middle region or the hollow region on the display panel.

The beneficial effects of the present disclosure are as follows.

According to the display panel and the display device provided in the embodiments of the present disclosure, the display panel includes a display area and a non-display area adjacent to the display area. Where the display area includes a first display area and a second display area, each of the first display area and the second display area includes a plurality of pixels arranged in an array, and the quantity of pixels in at least one row of pixels in the first display area is less than the quantity of pixels in any row of pixels in the second display area. The display panel further includes a gate driving circuit and a plurality of scan signal lines, the gate driving circuit is arranged in the non-display area, each of the scan signal lines is connected to an output terminal of the gate driving circuit, and at least one of the scan signal lines provides a scan signal for a row of the pixels. The display panel further includes: resistance compensation units connected to the scan signal lines of the first display area; where the resistance compensation units are metal or metal oxide conducting wires. By connecting the scan signal lines of the first display area to the resistance compensation units, the loads of the scan signal lines connected to the resistance compensation units may be increased, so as to reduce the load differences between the scan signal lines of the first display area and between the scan signal lines of the first display area and the scan signal lines of the second display area to improve display uniformity of the display panel and enhance the display effect.

DETAILED DESCRIPTION OF THE EMBODIMENTS

Figure 1:
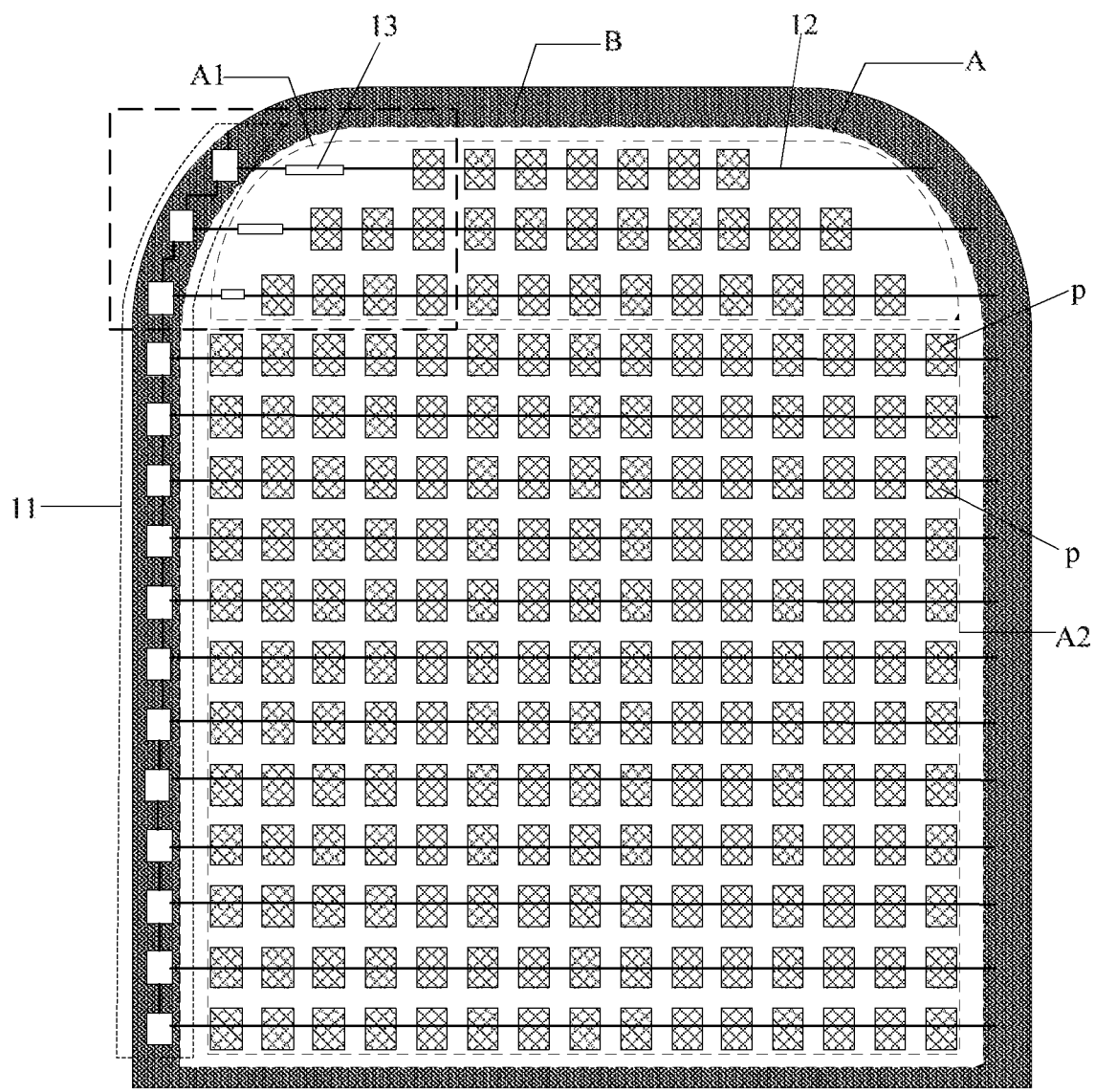
FIG. 1 is a first structural schematic diagram of a display panel provided in an embodiment of the present disclosure.

Embodiments of the present disclosure provide a display panel and a display device for improving the uniformity of display brightness and optimizing the display effect.

To make the foregoing objectives, features and advantages of the present disclosure clearer and more understandable, the present disclosure will be further described with reference to the accompanying drawings and embodiments. However, exemplary embodiments may be implemented in many forms and should not be construed as limited to the embodiments set forth herein; on the contrary, these embodiments are provided so that the present disclosure become more comprehensive and complete and the concepts of the exemplary embodiments are conveyed to those skilled in the art. The same reference numerals in the drawings denote the same or similar structures, and a repetitive description thereof will be omitted. Terms for indicating positions and directions in the present disclosure are all described by taking the drawings as examples. However, changes may be made if necessary, and all the changes are included in the protection scope of the present disclosure. The drawings of the present disclosure are only used to illustrate the relative position relationships, rather than representing true scales.

It should be noted that, the specific details are set forth in the following description in order to fully understand the present disclosure. However, the present disclosure may be implemented in various other manners different from those described herein, and one with ordinary skill in the art may make a similar generalization without departing from the spirit of the present disclosure. Therefore, the present disclosure is not limited to the specific embodiments disclosed below. The following description in the specification refers to preferred embodiments of the present application. However, the description is for the purpose of illustrating the general principles of the present application and is not intended to limit the scope of this application. The scope of this application shall be defined by the appended claims.

The display panel and the display device provided in the embodiments of the present disclosure are specifically described below with reference to the accompanying drawings.

FIG. 1 is a structural schematic diagram of a display panel provided in an embodiment of the present disclosure. As shown in FIG. 1, the display panel provided by the embodiment of the present disclosure includes a display area A and a non-display area B adjacent to the display area A.

The display area A includes a first display area A1 and a second display area A2. Each of the first display area A1 and the second display area A2 includes a plurality of pixels p arranged in an array. The quantity of pixels in at least one row in the first display area A1 is less than the quantity of pixels in any row in the second display area A2.

The display panel provided in the embodiment of the present disclosure further includes a gate driving circuit 11 and a plurality of scan signal lines 12. The gate driving circuit 11 is arranged in the non-display area B, and each of the scan signal lines 12 is connected to the output terminal of the gate driving circuit 11, and at least one of the scan signal lines 12 provides a scan signal for a row of pixels.

As shown in FIG. 1, the display panel provided in the embodiment of the present disclosure further includes resistance compensation units 13 connected to the scan signal lines 12 of the first display area A1, and the resistance compensation units 13 may be metal or metal oxide conducting wires.

In practice, in order to meet some special requirements, the display panel may be designed to have a non-rectangular irregular shape, which is usually referred to as a special-shaped area of the display panel. As shown in FIG. 1 which illustrates the structure of the display panel, the corner portions of the display panel also include special-shaped areas. In a manufacturing process, there usually exists a difference between the quantity of pixels in each row in a special-shaped area and the quantity of pixels in each row in a conventional area. As shown in FIG. 1, in the display panel provided in the embodiment of the present disclosure, the first display area A1 may be considered a special-shaped area as described above, the second display area A2 may be considered a conventional area, the quantity of pixels in at least one row of pixels p in the first display area A1 is less than the quantity of pixels in any row of pixels p in the second display area A2. In this case, the scan signal lines for driving the pixels in rows are different in load due to the difference in the quantity of pixels on connecting signal lines. When the same signal is loaded, there are also differences between the signals input to the pixels, resulting in the problem of mura of display.

In view of this, in the display panel provided in the embodiment of the present disclosure, the resistance compensation units 13 connected to the scan signal lines 12 are disposed in the first display area to compensate the load difference of the scan signal lines due to the smaller quantity of pixels, so as to reduce the load difference between the scan signal lines in the first display area and the load difference between the scan signal lines in the first display area and the scan signal lines in the second display area to improve the problem of mura of display of the display panel and enhance the display effect.

In practice, the scan signal lines are usually connected to the output terminal of the gate driving circuit 11 located in the non-display area B on both sides of the display panel. The gate driving circuit 11 may be composed of a plurality of cascaded shift registers. The first-stage shift register provides a row of pixels with a scan signal that is provided by a scan signal line to each connected pixel. In a specific implementation, the scan signal line may be a scan signal line for controlling whether data is written or a light emitting control scan signal line for controlling a light emitting device to emit light, which is not limited herein.

As described above, the resistance compensation units provided by the embodiment of the present disclosure may be metal or metal oxide conducting wires. Since the display panel used in the present stage is usually controlled by a thin film transistor, and a poly-metal, a metal oxide or other material needs to be used in the formation of the thin film transistor, the resistance compensation units in the embodiments of the present disclosure may be made of the same metal or metal oxide material, and may be arranged in the same layer at the corresponding material layer to reduce the patterning process for manufacturing the resistance compensation units separately and improve the production efficiency.

In a specific implementation, the resistivity of the resistance compensation units made of a specific material also varies according to the difference of the material used in the metal or the metal oxide. In the embodiment of the present disclosure, the resistance compensation units are made using the same material as that forming various layers of metal or metal oxide, and the resistivity of the material may be in the range of 0.55-5.6 Ωm. However, in an actual manufacturing process, the resistivity of the resistance compensation units may exceed the above range due to the difference of materials used, which is also within the protection scope of the present disclosure. The embodiments of the present disclosure do not specifically limit the value of the resistivity.

Figure 2:
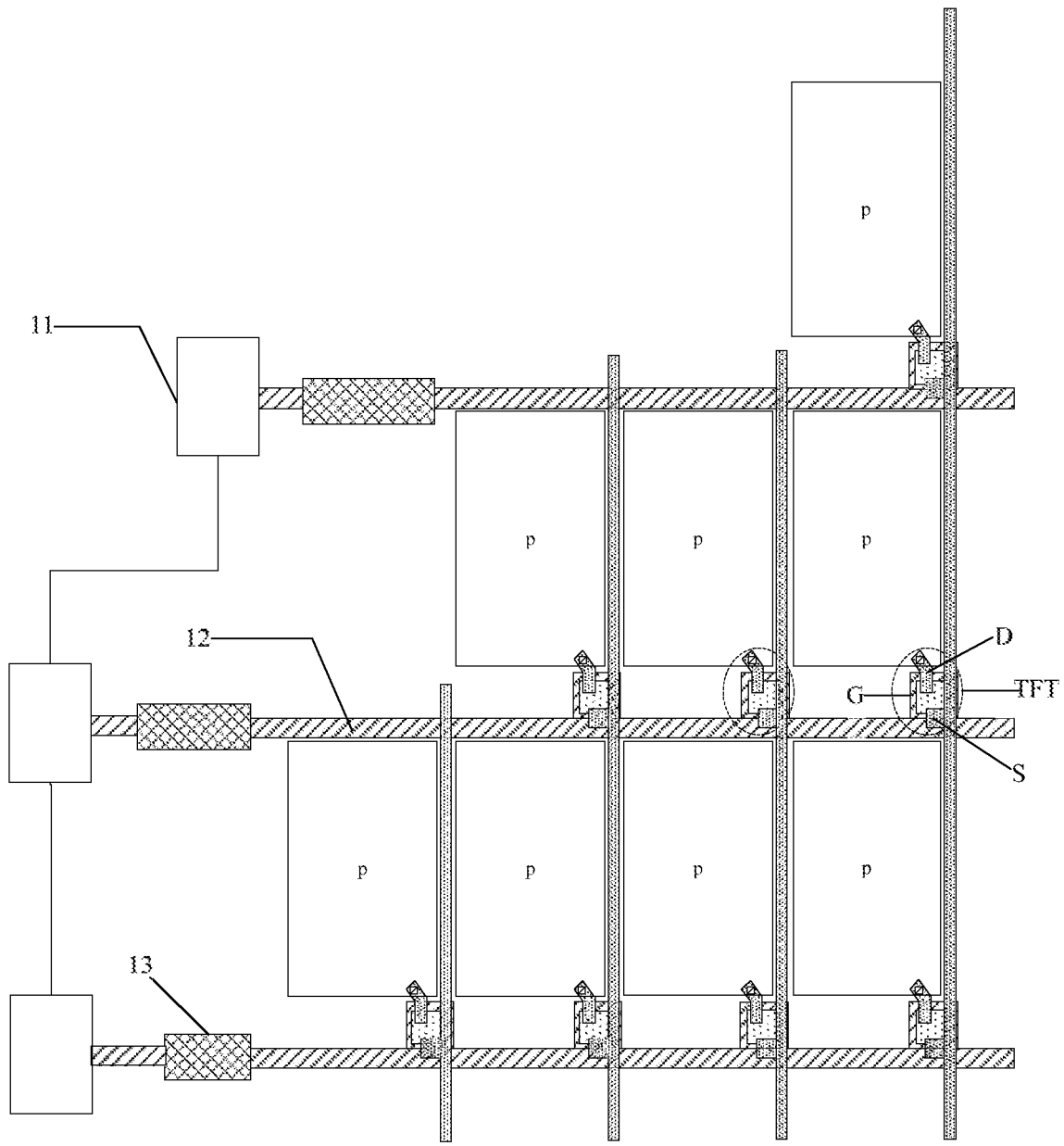
FIG. 2 is a partial enlarged view of FIG. 1.
Figure 3:
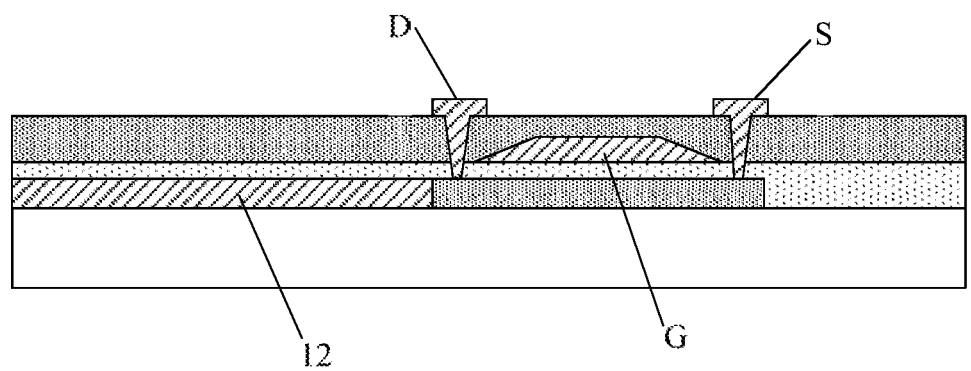
FIG. 3 is a cross-sectional view of a thin film transistor provided in an embodiment of the present disclosure.

FIG. 2 is a partial enlarged view of the display panel in the rectangular dashed box at the upper left corner of FIG. 1. As shown in FIG. 2, the display panel provided in the embodiment of the present disclosure further includes: thin film transistors (TFTs) located in the display area and arranged in one-to-one correspondence to the pixels p. Each thin film transistor TFT includes a gate G, a source S and a drain D. As shown in FIG. 3 which is a cross-sectional view of a thin film transistor, the source S and the drain D are arranged at the same layer, the gate G and the source S are arranged at different layers. The thin film transistor shown in FIG. 3 is of a top gate structure and may be a thin film transistor formed by using low temperature polycrystalline silicon technology. In practice, the thin film transistor may also be a thin film transistor formed by other methods, and may be of a top gate structure and may also be of a bottom gate structure, which is not limited herein. Since a scan signal line 12 usually needs to be connected to the gate G of the thin film transistor to control the gate of the thin film transistor to further control the thin film transistor to be turned on or turned off, the scan signal line may be arranged at the same layer as the gate G, which facilitates the connection between the scan signal line 12 and the gate G and also may omit the patterning process for separately forming the scan signal line.

Figure 4:
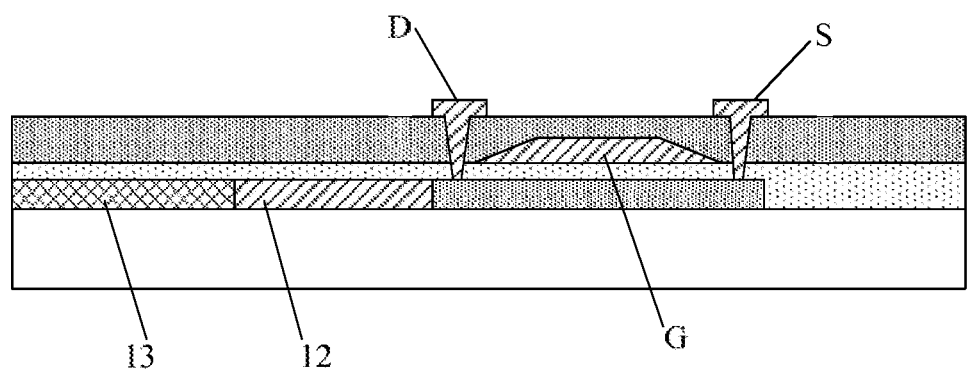
FIG. 4 is a first connection schematic diagram of a resistance compensation unit provided in an embodiment of a present disclosure.

In a possible implementation, as shown in FIG. 4 which illustrates a connection schematic diagram of a resistance compensation circuit and a scan signal line, the resistance compensation unit 13 is arranged at the same layer as the gate G. In this case, the resistance compensation unit 13 may be made of the same material as the gate G. As described above, the resistance compensation unit 13 is connected to the scan signal line 12 for compensating the load of the scan signal line connected to a smaller quantity of pixels. The scan signal line 12 may be located at the same metal or metal oxide layer as the gate G of the thin film transistor. Therefore, the resistance compensation unit 13 is also located at the same layer as the gate G to facilitate the interconnection between the resistance compensation unit 13 and the scan signal line 12. The resistance compensation unit 13 is metal or metal oxide conducting wire and the resistance change of the resistance compensation unit 13 is controlled by changing the line width or length of the conducting wire.

Figure 5:
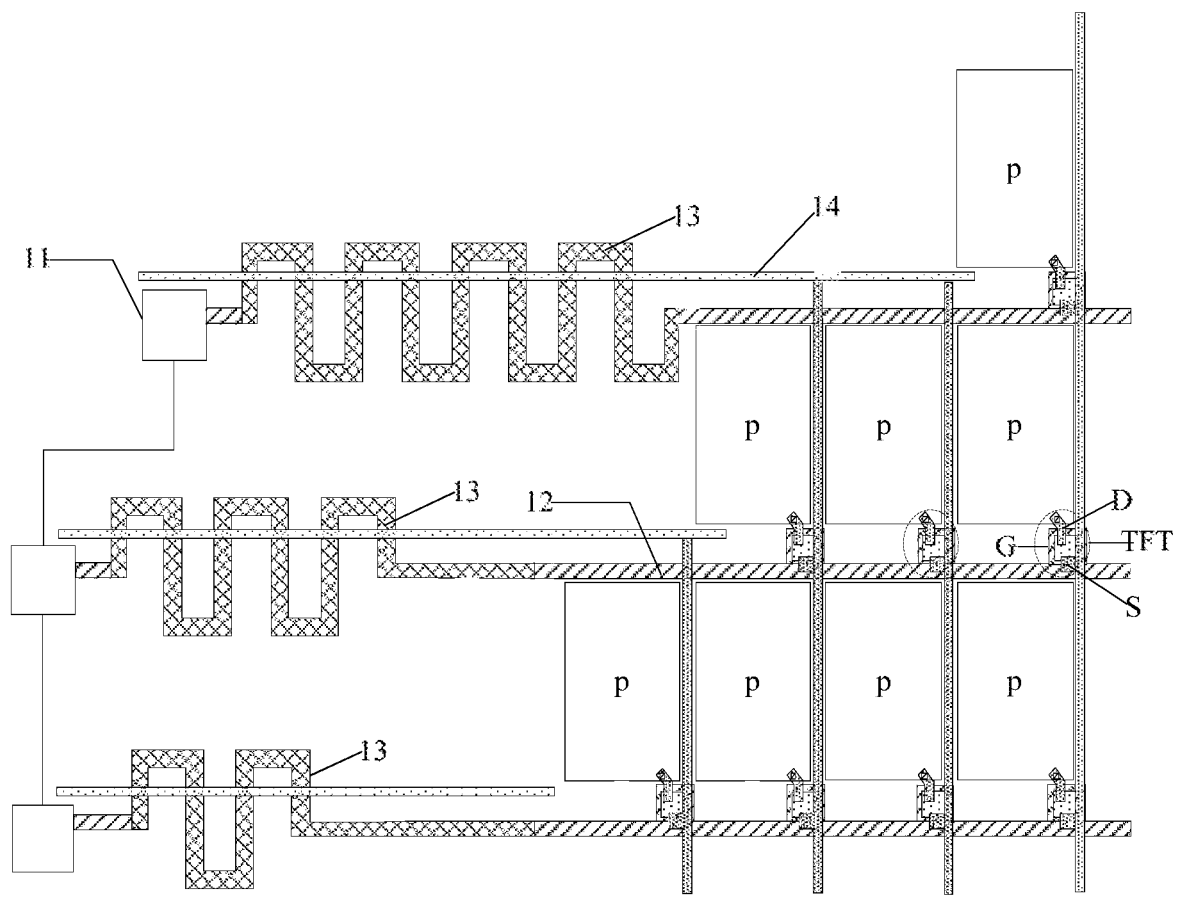
FIG. 5 is a first top view of resistance compensation units provided in an embodiment of the present disclosure.

FIG. 5 is a top view of resistance compensation units provided in an embodiment of the present disclosure. As shown in FIG. 5, the display panel provided in the embodiment of the present disclosure further includes signal lines 14; the resistance compensation units 13 and the signal lines 14 may have overlapped areas in a direction perpendicular to the display panel.

In practice, the signal lines 14 may be signal lines for providing reference signals or fixed potential signals to the display panel, and the signal lines 14 and the resistance compensation units are arranged at different layers. As shown in FIG. 5, the signal lines 14 may be located at metal or metal oxide layer above the resistance compensation units and are overlapped with the resistance compensation units 13 in a direction perpendicular to the display panel. Since the resistance compensation units and the signal lines are both made of a metal or metal oxide, there are parasitic capacitors in the overlapped areas and this part of capacitors may also be used to increase the loads of the scan signal lines. By increasing the loads of the scan signal lines connected to a smaller quantity of pixels in each row, the load difference between these scan signal lines and the scan signal lines connected to a larger quantity of pixels may be compensated, thereby improving the display brightness uniformity of the display panel.

Figure 6:
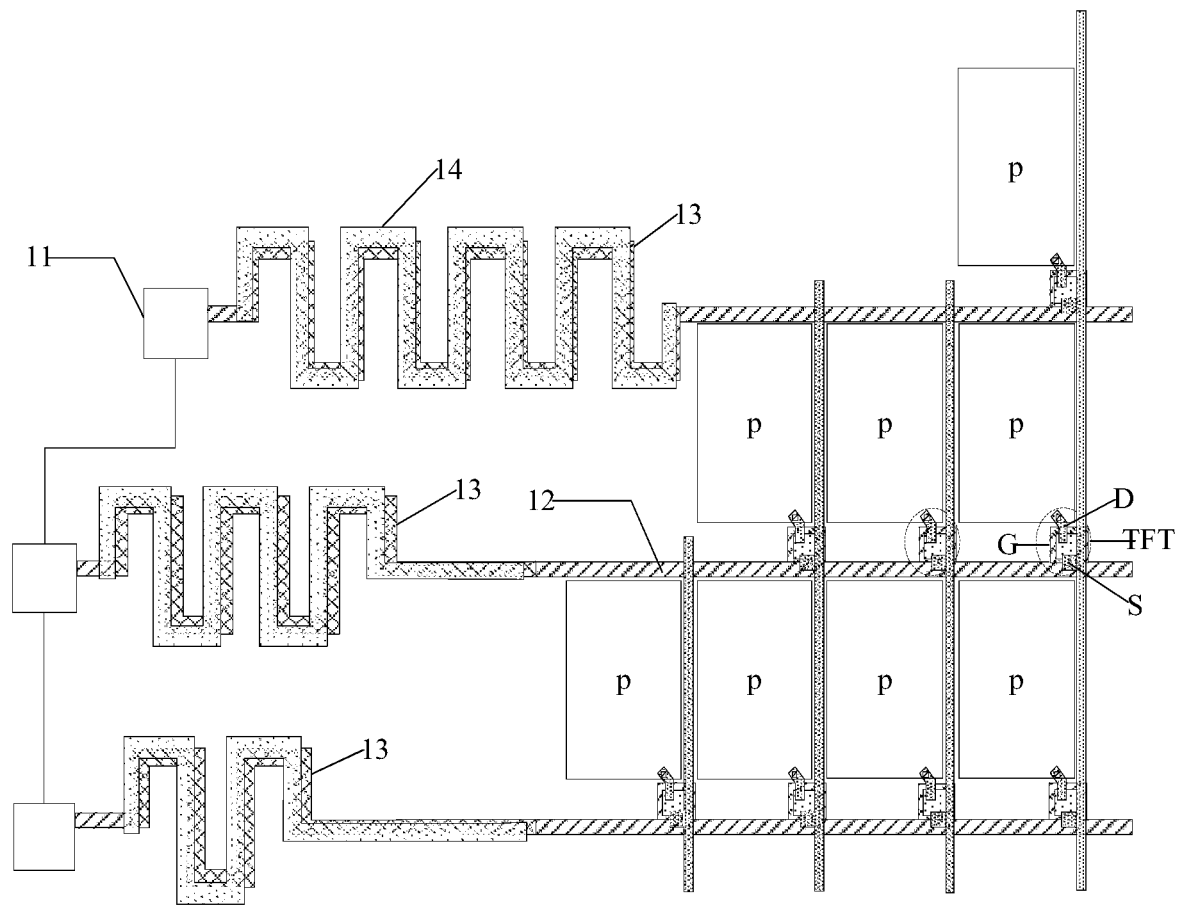
FIG. 6 is a second top view of resistance compensation units provided in an embodiment of the present disclosure.

In order to further increase the capacitance between the resistance compensation units 13 and the signal lines 14 arranged at different layers from the resistance compensation units 13, the area of the overlapped area between the two may be increased. Another top view of the resistance compensation units is as shown in FIG. 6. The signal lines 14 may be consistent with the resistance compensation units 13 in pattern and the signal lines 14 are arranged right above the resistance compensation units 13 to effectively increase the overlapped areas between the resistance compensation units 13 and the signal lines 14 in the direction perpendicular to the display panel and increase the capacitance between the resistance compensation units 13 and the signal lines 14; and in combination with the resistance increased by the resistance compensation units 13, the loads of the scan signal lines 12 connected to the resistance compensation units 13 are increased and the load difference and delay difference between the scan signal lines and other scan signal lines are reduced, thus achieving the brightness uniformity of the display panel and improving the display effect.

Figure 7:
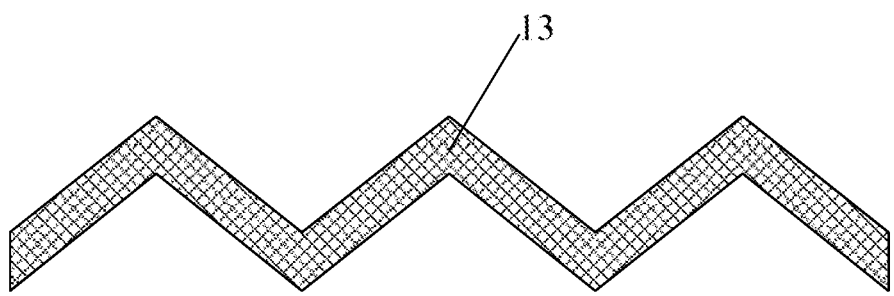
FIG. 7 is a first structural schematic diagram of a resistance compensation unit provided in an embodiment of the present disclosure.
Figure 8:
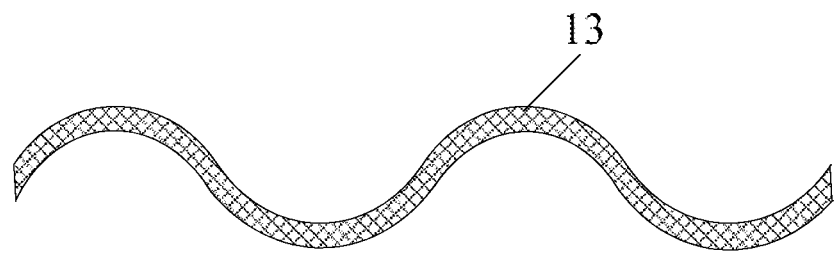
FIG. 8 is a second structural schematic diagram of a resistance compensation unit provided in an embodiment of the present disclosure.

In a specific implementation, in order to increase the resistances of the resistance compensation units 13, this part of the metal or metal oxide conducting wires may be arranged in a form of winding. For example, as shown in FIG. 7 which is a structural schematic diagram of a resistance compensation unit, the metal or metal oxide conducting wire (i.e., the above-mentioned resistance compensation unit) may be configured as a fold line shape. As shown in FIG. 8 which is another structural schematic diagram of a resistance compensation unit, the metal or metal oxide conducting wire may also be configured in a curved shape. Alternatively, the metal or metal oxide conducting wire may also be configured as a helical line shape or the like that is reciprocating folded back as shown in FIG. 5 and FIG. 6. In addition, in order to increase the lengths of the metal or metal oxide conducting wires to increase resistances, the metal or metal oxide conducting wires may also be configured into other irregular shapes, which are not listed here in the embodiment of the present disclosure and are not specifically limited.

From the resistance formula of a conductor $R=\rho L/S$, it can be seen that in the case of the resistivity $\rho$ of a resistor is a constant, the longer the length L and the smaller the cross-sectional area S, the larger the resistance R. However, in practice, the material used for the resistance compensation units is fixed, so the resistance values of the metal or metal oxide conducting wires may be changed by changing the lengths and/or cross-sectional areas of the metal or metal oxide conducting wires serving as the resistance compensation units. As mentioned above, in order to increase the lengths of the metal or metal oxide conducting wires, the shape of the conducting wires may be set in the form of winding, and at the same time the resistance values of the conducting wires may be controlled in conjunction with the cross-sectional areas of the conducting wires. Usually, the pattern of the metal layer is formed by depositing a metal layer of a predetermined thickness, and then the thickness of the metal layer is generally fixed. In this case, the cross-sectional area of a metal/metal oxide conducting wire depends on the line width of the metal/metal oxide conducting wire. In the embodiment of the present disclosure, the resistance values of the metal/metal oxide conducting wires may be changed by changing the lengths and line widths of the metal or metal oxide conducting wires to change the loads of the connected scan signal lines.

Due to the space limitation for arrangement of the resistance compensation units 13, the resistance compensation unit corresponding to a scan signal line with a larger compensation load need has an extendible conducting wire with limited length. In this case, the line width of the conducting wire may be reduced appropriately to increase the resistance. Taking into account the limitations of the process, the line widths of the metal or metal oxide conducting wires may be set to be 2.5-3 µm. In specific practice, the length and line width of the metal/metal oxide conducting wire may be set according to the resistance value to be compensated. With the increase of the technological level, the line width of the metal conducting wire is reduced to go beyond the above range, which is not limited specifically here in the embodiment of the present disclosure.

Figure 9:
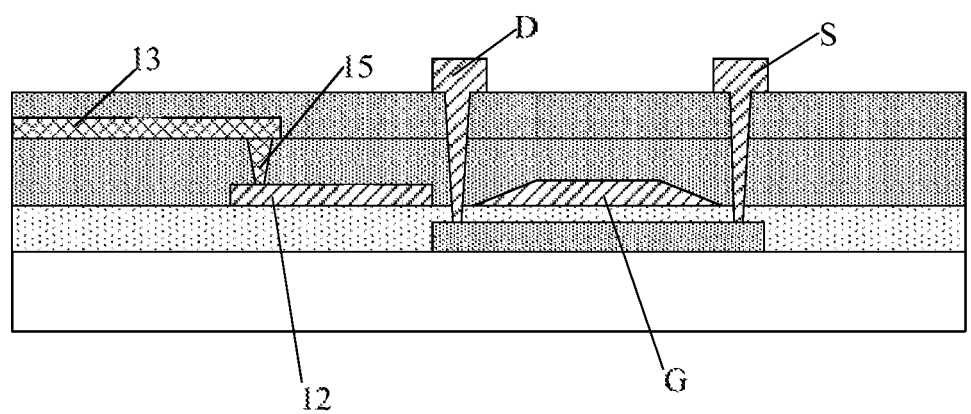
FIG. 9 is a second connection schematic diagram of a resistance compensation unit provided in an embodiment of the present disclosure.

In another possible implementation, as shown in FIG. 9 which is another schematic diagram illustrating connection between a resistance compensation unit 13 and a scan signal line 12 provided in an embodiment of the present disclosure, the resistance compensation unit 13 may be arranged at the metal layer between the gate G and the source S. The gate G, source S and drain D of a thin film transistor may be usually made of a metal or metal oxide material. The source S and the drain D are arranged at the same layer and are formed by performing patterning process once; the gate G and the source S are arranged at different layers with at least one layer of insulating material therebetween. After the formation of the gate G and before the formation of the source S and the drain D, another layer of metal or metal oxide material may be further formed for forming a pattern of an electrode of a storage capacitor. The resistance compensation unit 13 provided in the embodiment of the present disclosure is metal/metal oxide conducting wire. Therefore, the resistance compensation unit 13 may be arranged at the same layer as the metal/metal oxide layer located between the gate G and the source S, a one-time patterning process is used to form a pattern of capacitor electrodes and a resistance compensation unit, thereby saving process steps and improving production efficiency.

Figure 10:
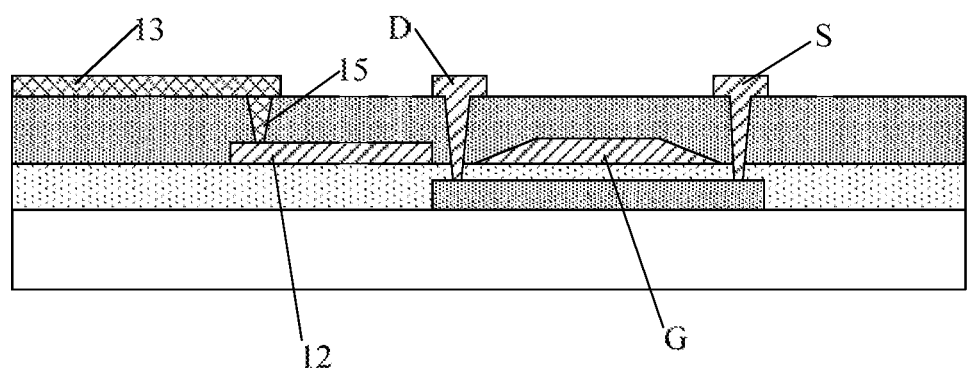
FIG. 10 is a third connection schematic diagram of a resistance compensation unit provided in an embodiment of the present disclosure.

In another possible implementation, as shown in FIG. 10 which is another schematic diagram illustrating connection between a resistance compensation unit 13 and a scan signal line 12, provided in an embodiment of the present disclosure. The resistance compensation unit 13 may also be arranged at the same layer and made of the same material as the source S and is formed by one-time patterning process together with the source S and drain D, thus omitting the process step of separately forming the resistance compensation unit. In addition, arranging the resistance compensation unit 13 at the same layer as an electrode of the thin film transistor or the capacitor may further increase the thickness of the display panel.

As shown in FIG. 9 and FIG. 10, when the resistance compensation unit 13 is located at the metal/metal oxide layer between the gate G and the source S or when the resistance compensation unit 13 is arranged at the same layer as the source S, the resistance compensation unit 13 and the scan signal line 12 located at the gate layer may be connected through a via hole 15. In practice, the scan signal line 12 may also be arranged at other metal layer. When the scan signal line 12 and the resistance compensation unit 13 are arranged at different layers, the scan signal line 12 and the resistance compensation unit 13 may be connected with each other through a via hole. The metal layers at where the scan signal line and the resistance compensation unit 13 are located are not specifically limited in the embodiment of the present disclosure.

In a specific implementation, as shown in FIG. 1, the resistance compensation units 13 may be arranged between the gate driving circuit 11 and the scan signal lines 12. At present, display devices such as smart phones require a higher screen-to-body ratio, that is, the border of the display panel is reduced as much as possible, so that more area is used for display. In this case, for the position having a special-shaped display area, the foregoing arrangement manner provided in the embodiment of the present disclosure is adopted to arrange the resistance compensation units between the gate driving circuit and the scan signal lines; therefore, edge positions will not be occupied so that more space may be used for arranging displayable pixels, so as to improve the screen-to-body ratio. In the display panel structure shown in FIG. 1, the gate driving circuit 11 is located at one side of the display area A. In practice, the gate driving circuits 11 may also be located at both sides of the display area A so as to adopt a two-side driving manner to drive the pixels in the display area A to emit light. In such a case, the resistance compensation units 13 may be arranged between the gate driving circuits on both sides and the scan signal lines so as to compensate the loads of the scan signal lines connected to a smaller quantity of pixels, to improve the uniformity of display brightness.

Figure 11:
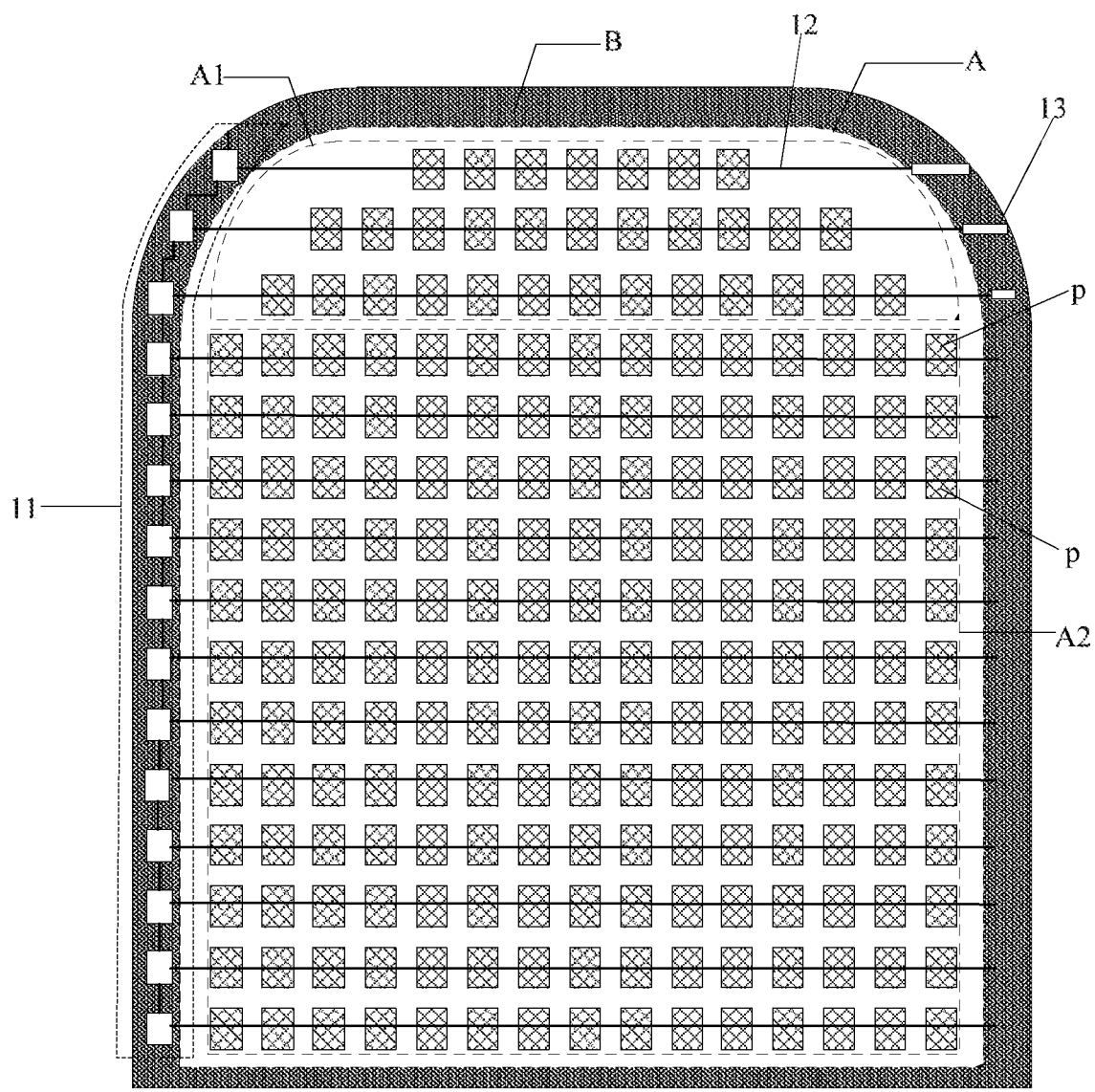
FIG. 11 is a second structural schematic diagram of a display panel provided in an embodiment of the present disclosure.

In addition, as shown in FIG. 11 which is a structural schematic diagram of another display panel provided in an embodiment of the present disclosure. The resistance compensation units 13 may also be located at the ends, far away from the gate driving circuit 11, of the scan signal lines 12. In practice, for example, a display device such as a smart watch with a circular display screen has a large difference in the quantity of pixels between a pixel row far away from the center of the circle and a pixel row closer to the center of the circle. In this case, when load compensation is performed on a scan signal line connected to a pixel row far away from the center of the circle, the space between the gate driving circuit and the scan signal line may not be enough to further increase the resistance of the resistance compensation unit. In this case, an additional resistance compensation unit may be arranged at an end, far away from the gate driving circuit, of the scan signal line on this base to increase the load of the scan signal line. In addition, in the same display panel, the arrangement positions of the resistance compensation units 13 may be flexibly set, a part of the resistance compensation units 13 may be arranged between the scan signal lines 12 and the gate driving circuit 11, and the other part of the resistance compensation units 13 may be arranged at the ends, far away from the gate driving circuit 11, of the scan signal lines 12, which is not limited in the embodiment of the present disclosure.

Figure 12:
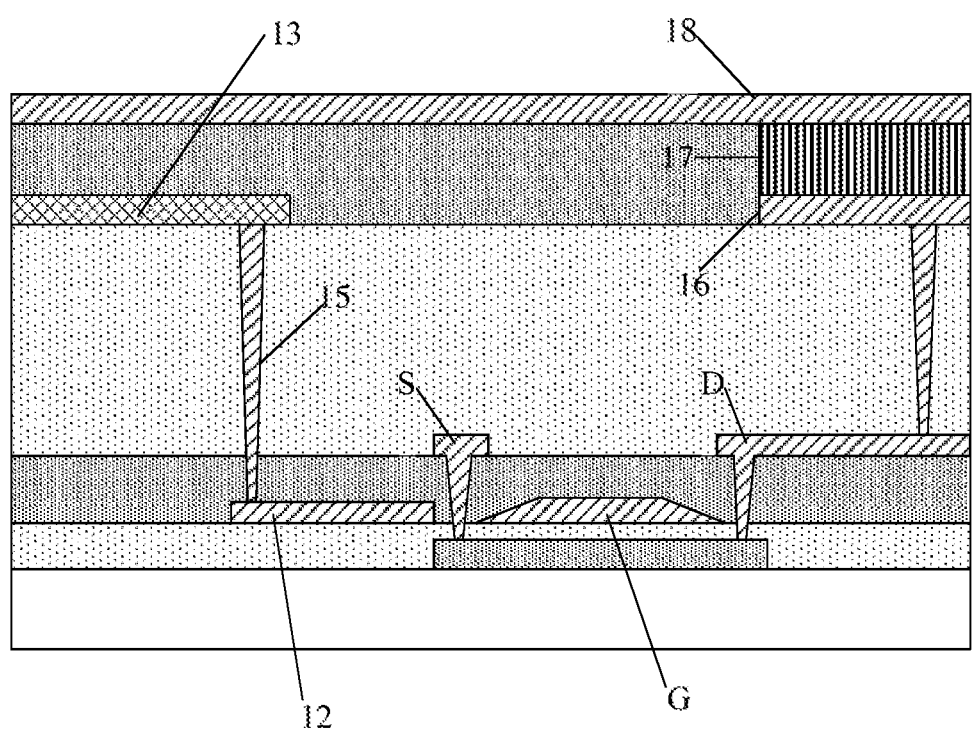
FIG. 12 is a fourth connection schematic diagram of a resistance compensation unit provided in an embodiment of the present disclosure.

In another possible implementation, the display panel provided in the embodiment of the present disclosure may be an organic light emitting display panel. The position of a resistance compensation unit included in the organic light emitting display panel may be found in FIG. 12 which is another schematic diagram illustrating connection between a resistance compensation unit 13 and a scan signal line 12 provided in an embodiment of the present disclosure. Each pixel in the display panel provided in the embodiment of the present disclosure may include an anode 16, a light-emitting layer 17 and a cathode 18 that are stacked one above another, and the resistance compensation unit 13 may be arranged at the same layer and made of the same material as the anode 16.

The anodes in the organic light emitting display panel provided in the embodiment of the present disclosure may be arranged in an array. Each anode 16 and the light emitting layer 17 and the cathode 18 that are located above the anode 16 form an organic light emitting diode device. The anodes have a set pattern, and the cathodes are usually arranged as a whole layer. Therefore, the resistance compensation units 13 may also be arranged at the same layer and made of the same material as the anodes, and may be formed by one-time patterning process together with the anodes to save process steps. In this case, the resistance compensation units 13 may be connected to the scan signal lines below through via holes 15.

Figure 13:
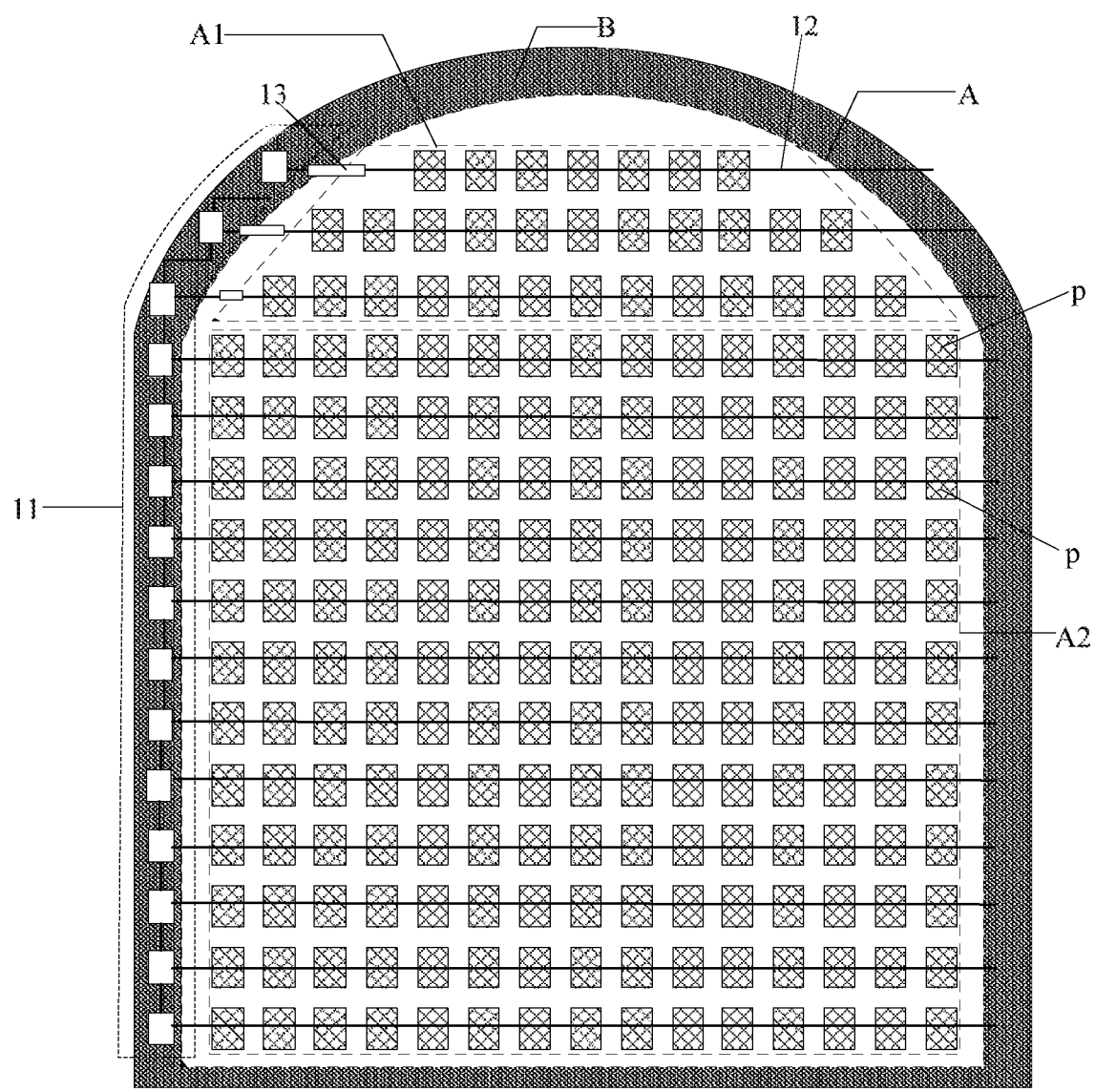
FIG. 13 is a third structural schematic diagram of a display panel provided in an embodiment of the present disclosure.

The display panels provided in the embodiments of the present disclosure are all display panels including a special-shaped display area. Since the first display area includes pixel rows that are not equal in quantity to the normally-arranged pixels in the second display area, the edge of the first display area may be special-shaped to meet the specific shape or display requirements. As shown in FIG. 13 which is a structural schematic diagram of a display panel provided in an embodiment of the present disclosure, a part of the edge of the first display area is a curved edge. Taking the display panel structure shown in FIG. 13 as an example, the curved edge may be of an axisymmetric structure, the quantities of pixels in the respective pixel rows in the first display area A1 decrease as the distance from the second display area A2 increases. In this case, the resistance of the resistance compensation unit connected to the outermost scan signal line in the first display area is set to be the maximum and the resistances of the resistance compensation units connected to the scan signal lines may gradually decrease as the distance from the second display area A2 decreases.

Figure 14:
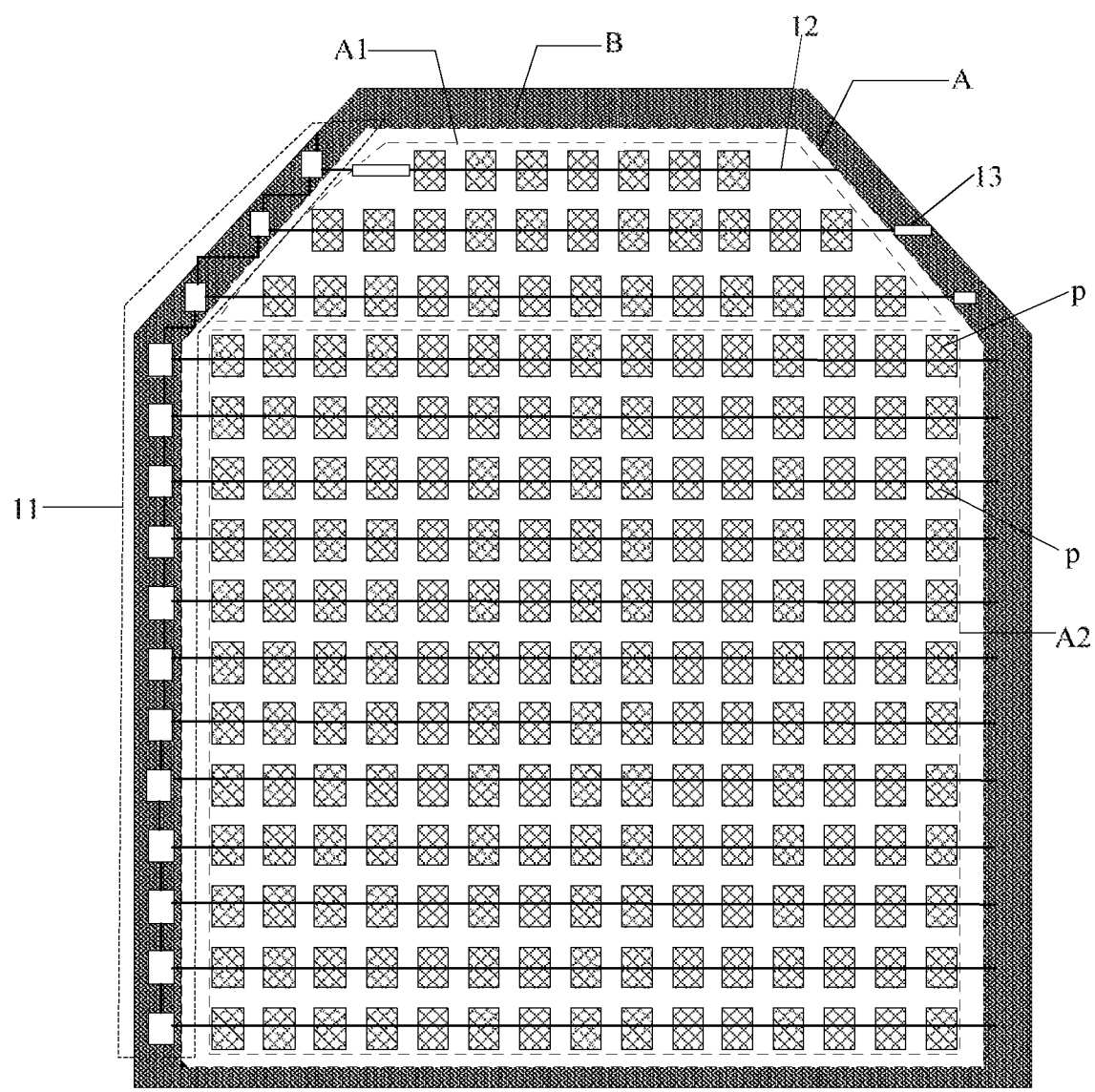
FIG. 14 is a fourth structural schematic diagram of a display panel provided in an embodiment of the present disclosure.

In another possible implementation, as shown in FIG. 1, the corner of the first display area A1 in the display panel provided in the embodiment of the present disclosure may be a rounded corner. Alternatively, as shown in FIG. 14 which is another structural schematic diagram of the display panel provided in an embodiment of the present disclosure, the corners of the display panel may be chamfered corners. In addition, as shown in FIG. 15 which shows the structure of another display panel provided in an embodiment of the present disclosure, a notch may be further included at the corner of the first display area.

Further, no matter which structure of the display panel described above is adopted, there is a load difference between the scan signal lines connecting the pixels in rows in the first display area A1 and the scan signal lines in the second display area A2. As shown in FIG. 1 and FIG. 14, the quantities of pixels in the respective pixel rows in the first display area A1 decrease as the distance from the second display area A2 increases. In this case, the resistance of the resistance compensation unit connected to the outermost scan signal line in the first display area is set to be the maximum and the resistances of the resistance compensation units connected to the scan signal lines may gradually decrease as the distance from the second display area A2 decreases.

Figure 15:
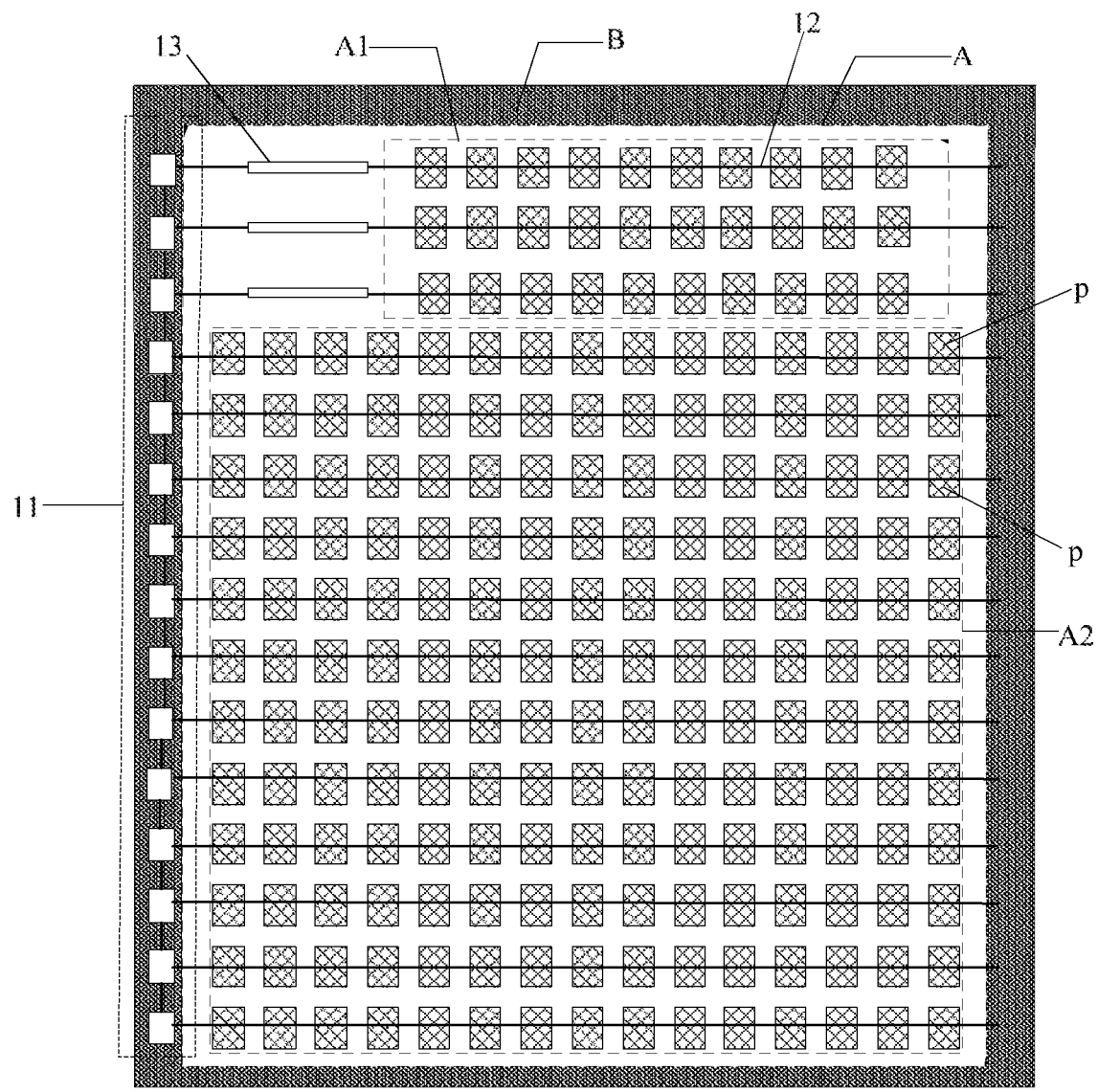
FIG. 15 is a fifth structural schematic diagram of a display panel provided in an embodiment of the present disclosure.

For the structure of the display panel shown in FIG. 15, the notch at the corner is a rectangular notch. Therefore, the quantity of pixels in each row of pixels in the first display area A1 is the same, and with respect to the scan signal lines connected to the second display area A2, the resistance compensation units 13 of the scan signal lines connecting the pixels in rows in the first display area A1 may be set to have the same resistance, so as to improve the brightness uniformity of the display panel.

In practice, there is not only one type of the scan signal lines connected to the pixel rows of the display panel, and the pixel rows in the first display area and the second display area are respectively connected to many types of scan signal lines. In the display panel structure shown in FIG. 16, at least two scan signal lines are respectively connected to a resistance compensation unit. Because the quantities of pixels in the pixel rows are not the same, there is a problem of load difference occurring in each type of scan signal lines. In this embodiment of the present disclosure, the loads of the scan signal lines may be compensated for each type of scan signal lines in the manner provided in the present disclosure so that the brightness uniformity of the display panel may be improved to the greatest extent.

Figure 16:
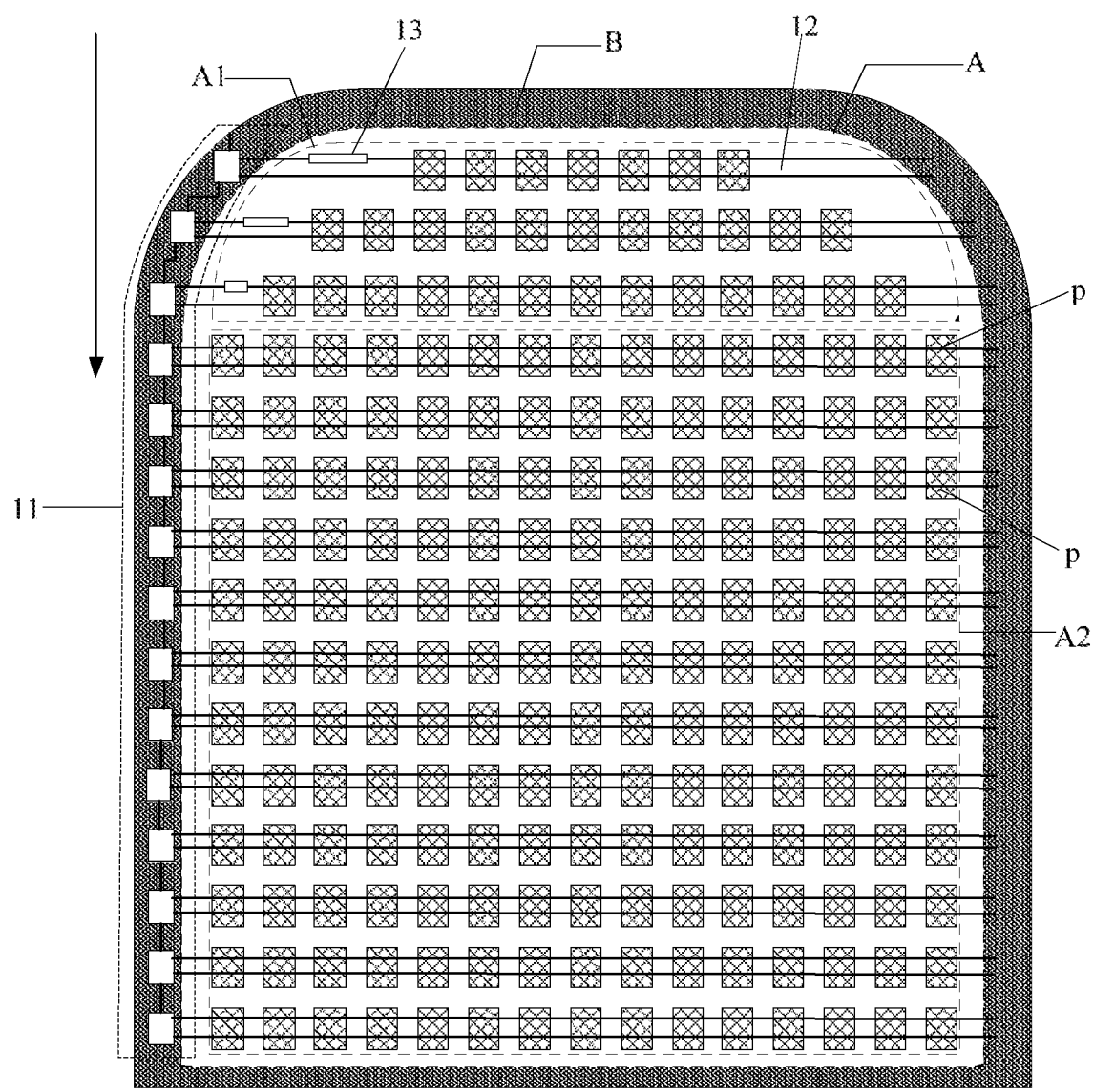
FIG. 16 is a sixth structural schematic diagram of a display panel provided in an embodiment of the present disclosure.

As shown in FIG. 16, the quantities of pixels in respective pixel rows in the first display area A1 sequentially increase along the column direction (i.e., the direction indicated by the arrow in FIG. 16). Since the loads of the scan signal lines connected to the pixel rows with a larger quantity of pixels are larger than the loads of the scan signal lines connected to the pixel rows with the smaller quantity of pixels, the resistances of the corresponding resistance compensation units may be adjusted according to the difference in the quantity of pixels in the pixel rows connected to the same type of scan signal lines. Taking the display panel structure shown in FIG. 16 as an example, when the quantities of pixels in the respective pixel rows sequentially increase along the column direction (i.e., the direction indicated by the arrow in FIG. 16), the resistances of the resistance compensation units connected to the same type of scan signal lines corresponding to the pixel rows may be set as sequentially decreasing in the column direction. In the embodiment of the present disclosure, the resistance values of the resistance compensation units are indicated by the length difference among the resistance compensation units. However, in practice, as described above, it is also possible to combine the line width of the conducting wires (metal or metal oxide conducting wires, that is, the resistance compensation units described above) to change the resistance values of the resistance compensation units.

In practice, when the resistance compensation units 13 are located at different metal or metal oxide layers, the materials used are different and there is a difference in the resistivity of the conducting wires serving as the resistance compensation units, which directly affects the resistance values of the resistance compensation units. For example, the gate of a thin film transistor and a metal layer for forming an electrode of a capacitor are usually made of the material of metal molybdenum (Mo), while the metal layers for forming the source and the drain of the thin film transistor are usually made of laminated metal aluminum and metal titanium (Ti/Al/Ti), different metal materials are different in resistivity, the metal conducting wires with the same length and the same line width are also different in resistance in the case of different resistivity. Therefore, in practice, it is necessary to set parameters of the conducting wires, such as length and line width, in combination with the conductor material used in the resistance compensation units so that the resistances of the conducting wires are adapted to the setting requirements.

Taking the display panel structure shown in FIG. 16 as an example, the difference between the resistance of the resistance compensation unit 13 corresponding to the pixel row having the smallest quantity of pixels (i.e., the pixel row located at the top in the first display area A1 in FIG. 16) and the resistance of the resistance compensation unit corresponding to the pixel row having the largest quantity of pixels (i.e., the pixel row located at the bottom in the first display area A1 in FIG. 16) may not be greater than 1110Ω. In the case of a display screen with the fixed resolution in an existing smart phone, the quantity of pixels in each row of pixels is basically fixed. Therefore, the load difference of the scan signal lines may be calculated according to the difference in the quantity of pixels in each row so as to determine the resistance values to be compensated for the connected resistance compensation units. For example, in the display panel structure shown in FIG. 16, the difference between the resistance value of the resistance compensation unit corresponding to the pixel row having the smallest quantity of pixels and the resistance value of the resistance compensation unit corresponding to the pixel row having the largest quantity of pixels may be 1100Ω. If the difference in the quantity of pixels between the pixel row having the smallest quantity of pixels and the pixel row having the largest quantity of pixels is slight, the resistance value difference between the resistance compensation units corresponding to the pixel row having the smallest quantity of pixels and the pixel row having the largest quantity of pixels may be less than 1100Ω. In a display panel used in the current stage, such as a mobile phone, other non-display functional elements may also be arranged at the edge of a display screen. In this case, the difference in the quantity of pixels between the pixel rows may be larger, and the difference between the maximum resistance value and the minimum resistance value of the resistance compensation units also increases, for example, may increase to be more than 2000Ω. In practice, it could be flexibly set according to the actual situation, which will not be limited specifically herein.

Figure 17:
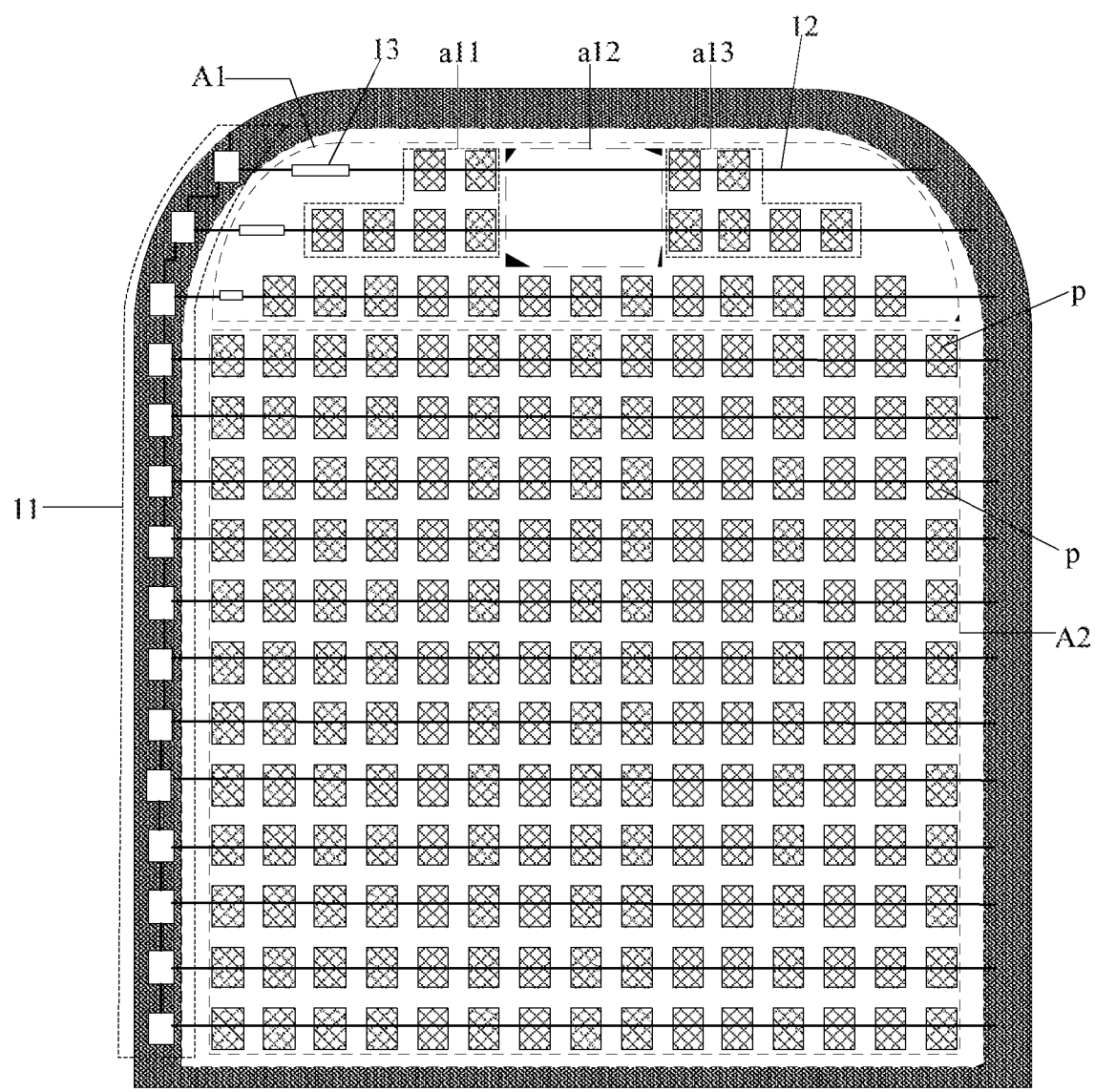
FIG. 17 is a seventh structural schematic diagram of a display panel provided in an embodiment of the present disclosure.

As shown in FIG. 17 which is a structural schematic diagram of another display panel provided in an embodiment of the present disclosure, the first display area A1 may include a first subregion a11, a middle region a12 and a second subregion a13. Where the first subregion a11 and the second subregion a13 are located at two sides of the middle region a12; a part of pixels in each row of pixels in the first display area are located in the first subregion a11 and a part of pixels are located in the second subregion a13. The middle region a12 is not provided with pixels, and some components having other functions, such as a camera and a speaker and the like, may be arranged in the middle region. The embodiment of the present disclosure is described as an example in which the first display area A1 is located at the top of the second display area A2. In practice, the first display area A1 may also be located at the bottom of the second display area A2, and a touch element or the like may also be arranged at the position of the middle region a12, which is not limited herein.

In a specific implementation, the above-mentioned middle region a12 may be a hollow region or a transparent display region. Since the material and manufacturing process of pixels used in the transparent display region are different from those of pixels in the first subregion a11 and the second subregion a13 in some way, the pixels may be driven separately or in a coordinated way during pixel driving.

In addition, the above-mentioned first display area A1 and second display area A2 may also be driven by means of separate control or coordinated control. In the embodiment of the present disclosure, the first display area A1 is generally a special-shaped display area of an irregular shape. In a specific application, the first display area A1 may be configured to display a picture irrelevant to a display image, such as logo information and time information, and in this case, the driving may be performed separately to diversify the functions of the display panel. In another embodiment, in order to display an image to the greatest extent and improve the viewing experience, the first display area A1 and the second display area A2 may also be driven by means of coordinated control so that the display screen may display the image to the greatest extent.

Figure 18:
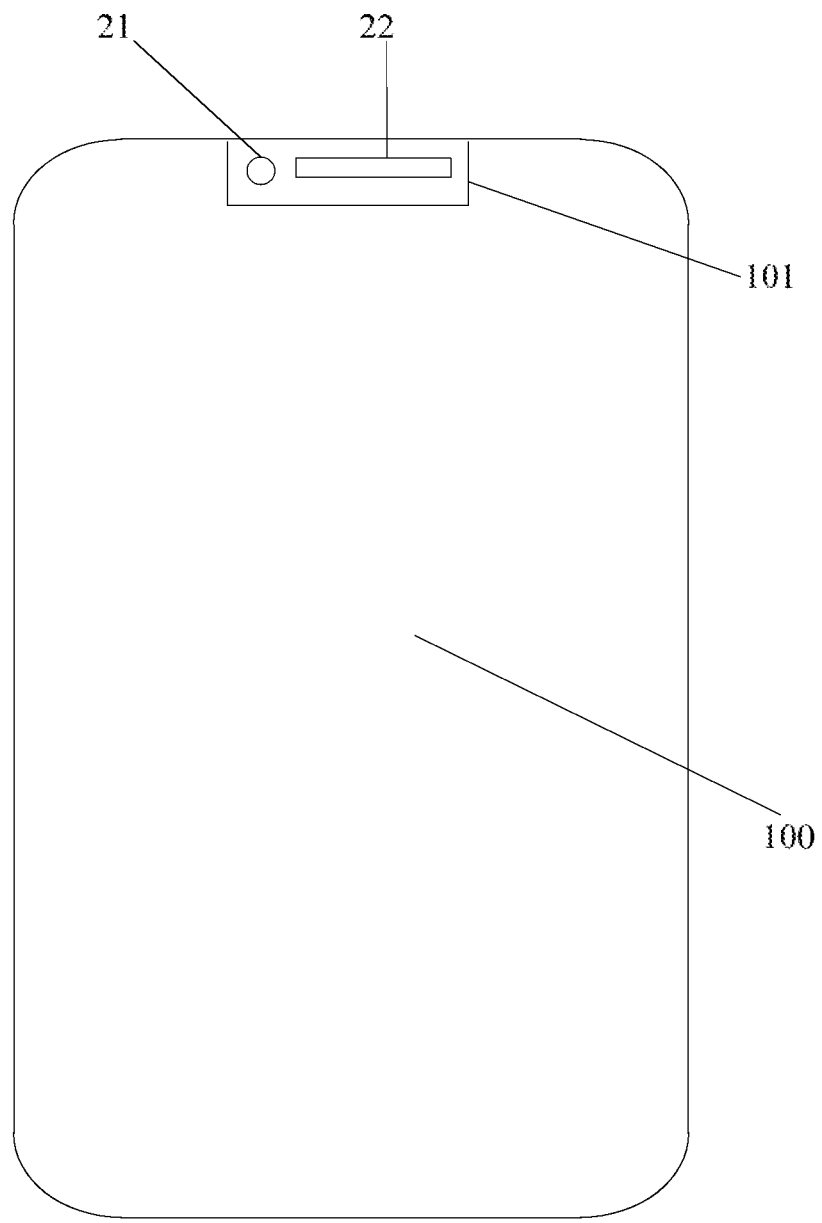
FIG. 18 is a structural schematic diagram of a display device provided in an embodiment of the present disclosure.

Based on the same inventive concept, an embodiment of the present disclosure further provides a display device, including any one of the foregoing display panels. The display device may be a display device such as a liquid crystal display, a liquid crystal television, an organic light-emitting diode (OLED) display or an OLED television etc. The display device may also be a mobile phone, a tablet computer, a notebook, a smart watch, a smart bracelet, VR/AR glasses and other mobile devices. As shown in FIG. 18 which is a top view of the display device provided by an embodiment of the present disclosure in the case where the display device is a mobile phone, the display panel may adopt the structure of any one of the foregoing display panels, which is not limited herein. Since the display device provided in the embodiment includes the display panel described in the above embodiments, the related advantages of the display panel are accordingly provided. For the implementation of the display device, reference may be made to the embodiments of the display panel described above where the repetitions will not be detailed again herein.

As shown in FIG. 18, the display device provided in the embodiment of the present disclosure further includes an image collecting structure 21. The image collecting structure 21 may be arranged in the middle region or the hollow region (101) of the display panel 100. In this structure, it is not necessary to remove pixels in rows for the image collecting structure 21 and the like, and only the positions for components such as the image collecting structure 21 need to be reserved in the middle position, thereby increasing the screen-to-body ratio.

As shown in FIG. 18, the display device provided in the embodiment of the present disclosure further includes a receiver 22 and may also include one or a combination of a light sensor, a distance sensor, an iris recognition sensor, and a fingerprint recognition sensor (not shown). The orthographic projection of one or a combination of the image collecting structure 21, the camera, the receiver, the light sensor, the distance sensor, the iris recognition sensor and the fingerprint recognition sensor on the display panel is located within the orthographic projection of the middle region or the hollow region (101) on the display panel. As a result, the display elements (such as pixels) and the non-display elements may be arranged in different regions so that the non-display elements do not occupy too much space to improve the screen-to-body ratio, which leads to a better viewing experience.

According to the display panel and the display device provided in the embodiments of the present disclosure, the display panel includes a display area and a non-display area adjacent to the display area. The display area includes a first display area and a second display area, each of the first display area and the second display area includes a plurality of pixels arranged in an array, and the quantity of pixels in at least one row of pixels in the first display area is less than the quantity of pixels in any row of pixels in the second display area. The display panel further includes a gate driving circuit and a plurality of scan signal lines, the gate driving circuit is arranged in the non-display area, each of the scan signal lines is connected to an output terminal of the gate driving circuit, and at least one of the scan signal lines provides a scan signal for a row of the pixels. The display panel further includes: resistance compensation units connected to the scan signal lines of the first display area; where the resistance compensation units are metal or metal oxide conducting wires. By connecting the scan signal lines of the first display area to the resistance compensation units, the load of the scan signal lines connected to the resistance compensation units may be increased, so as to reduce the load differences between the scan signal lines of the first display area and between the scan signal lines of the first display area and the scan signal lines of the second display area to improve display uniformity of the display panel to enhance the display.

Although the preferred embodiments of the present disclosure have been described, those skilled in the art may make other changes and modifications to these embodiments once they have acquired the basic inventive concept. Therefore, the appended claims are intended to be interpreted as including the preferred embodiments and all the changes and modifications that fall within the scope of the disclosure.

Obviously, those skilled in the art can make various modifications and variations to the present disclosure without departing from the spirit and scope of the present disclosure. Therefore, provided that these modifications and variations of the present disclosure fall within the scope of the claims of the present disclosure and their equivalent technologies, the present disclosure is also intended to include these modifications and variations.

What is claimed is:

1. A display panel, comprising: a display area and a non-display area adjacent to the display area,
    wherein the display area comprises a first display area and a second display area, each of the first display area and the second display area comprises a plurality of pixels arranged in an array;
    wherein a quantity of pixels in at least one row of pixels in the first display area is less than a quantity of pixels in any row of pixels in the second display area;
    wherein the display panel further comprises a gate driving circuit and a plurality of scan signal lines, wherein the gate driving circuit is arranged in the non-display area, the plurality of scan signal lines each is connected to an output terminal of the gate driving circuit, and wherein at least one of the plurality of scan signal lines provides a scan signal for a row of the pixels in either the first display area or the second display area;
    wherein the display panel further comprises resistance compensation units connected to the scan signal lines of the first display area, wherein the resistance compensation units are formed of metal or metal oxide conducting wires, and wherein the metal or metal oxide conducting wires are in a shape of a fold line, a curve or a spiral;
    wherein the display panel further comprises signal lines for providing reference signals to the display panel, wherein a longitudinal extension direction of each of the signal lines is the same as that of each of the plurality of scan signal lines;
    wherein one of the signal lines is arranged overlaying one of the resistance compensation units, and has a same pattern as said resistance compensation unit right below it;
    wherein an overlaying area between one of the signal lines and a resistance compensation unit right below it forms a capacitor;
    wherein the display panel further comprises thin film transistors located in the display area and arranged in one to one correspondence to the pixels;
    wherein each of the thin film transistors comprises a gate, a source and a drain, wherein the source and the drain being arranged at a same layer, and the gate and the source being arranged at different layers;
    wherein the resistance compensation units are arranged at a same layer and made of a same material as the gate; or
    each of the resistance compensation units is arranged at a metal layer between a gate layer and a source layer; or
    the resistance compensation units are arranged at a same layer and made of a same material as the source.

2. The display panel according to claim 1, wherein a resistivity of the resistance compensation units is 0.55-5.6 $\Omega$m.

3. The display panel according to claim 1, wherein a line width of each of the metal or metal oxide conducting wires is 2.5-3 μm.

4. The display panel according to claim 1, wherein the resistance compensation units and the scan signal lines are connected through via holes.

5. The display panel according to claim 1, wherein the resistance compensation units are arranged between the gate driving circuit and the scan signal lines; or
    the resistance compensation units are located at ends, far away from the gate driving circuit, of the scan signal lines.

6. The display panel according to claim 5, wherein each of the pixels comprises: an anode, a light emitting layer and a cathode that are arranged in a stack; and
    wherein the resistance compensation units are arranged at a same layer and made of a same material as the anode.

7. The display panel according to claim 1, wherein an edge of the first display area has a curved line, rounded corner, chamfered corner or notch.

8. The display panel according to claim 7, wherein the pixel rows in the first display area are respectively connected to various types of scan signal lines; and
    wherein at least two of the scan signal lines are respectively connected to one of the resistance compensation units.

9. The display panel according to claim 8, wherein quantities of pixels in respective pixel rows in the first display area sequentially increase in a column direction; and
    wherein resistances of the resistance compensation units connected to a same type of the scan signal lines corresponding to the pixel rows sequentially decrease in the column direction.

10. The display panel according to claim 9, wherein a difference between a resistance of one of the resistance compensation units corresponding to a pixel row having a smallest quantity of pixels and a resistance of one of the resistance compensation units corresponding to a pixel row having a largest quantity of pixels is not more than 1110$\Omega$.

11. The display panel according to claim 1, wherein the first display area comprises a first subregion, a middle region and a second subregion, wherein the first subregion and the second subregion are located on both sides of the middle region; and
    wherein a part of pixels in each row of pixels in the first display area is located in the first subregion, and remaining pixels in each row of pixels in the first display area are located in the second subregion.

12. The display panel according to claim 11, wherein the middle region is a hollow region or a transparent display region.

13. The display panel according to claim 12, wherein the first display area and the second display area are controlled separately or in a coordinated way.

14. A display device, comprising a display panel comprising a display area and a non-display area adjacent to the display area, wherein:
- the display area comprises a first display area and a second display area, each of the first display area and the second display area comprises a plurality of pixels arranged in an array; and a quantity of pixels in at least one row of pixels in the first display area is less than a quantity of pixels in any row of pixels in the second display area;
- wherein the display panel further comprises a gate driving circuit and a plurality of scan signal lines, wherein the gate driving circuit is arranged in the non-display area, the plurality of scan signal lines each is connected to an output terminal of the gate driving circuit, and at least one of the plurality of scan signal lines provides a scan signal for a row of the pixels in the display area;
- wherein the display panel further comprises resistance compensation units connected to the scan signal lines of the first display area;
- wherein the resistance compensation units are formed of metal or metal oxide conducting wires, wherein the metal or metal oxide conducting wires are in a shape of a fold line, a curve or a spiral;
- wherein the display panel further comprises signal lines for providing reference signals to the display panel, wherein a longitudinal extension direction of each of the signal lines is same as that of each of the plurality of scan signal lines, wherein one of the signal lines is arranged overlaying one of the resistance compensation units, and has a same pattern as said resistance compensation unit right below it,
- wherein an overlaying area between one of the signal lines and a resistance compensation unit right below it forms a capacitor;
- wherein the display panel further comprises thin film transistors located in the display area and arranged in one to one correspondence to the pixels;
- wherein each of the thin film transistors comprising a gate, a source and a drain, wherein the source and the drain being arranged at a same layer, and the gate and the source being arranged at different layers; wherein the resistance compensation units are arranged at a same layer and made of a same material as the gate; or
- each of the resistance compensation units is arranged at a metal layer between a gate layer and a source layer; or the resistance compensation units are arranged at a same layer and made of a same material as the source.

15. The display device according to claim 14, wherein the display device further comprises: an image collecting structure,
- wherein the first display area comprises a first subregion, a middle region and a second subregion; wherein the first subregion and the second subregion are located on both sides of the middle region, the image collecting structure is arranged in the middle region of the display panel.

16. The display device according to claim 15, wherein the display device further comprises: one or a combination of a receiver, a light sensor, a distance sensor, an iris recognition sensor and a fingerprint recognition sensor; and
- wherein an orthographic projection of one or a combination of the image collecting structure, the receiver, the light sensor, the distance sensor, the iris recognition sensor and the fingerprint recognition sensor in the display device on the display panel is located within an orthographic projection of the middle region or a hollow region on the display panel.

\* \* \* \* \*